(12) United States Patent
Khan et al.

(10) Patent No.: US 9,059,081 B2
(45) Date of Patent: Jun. 16, 2015

(54) SELECTIVELY DOPED SEMI-CONDUCTORS AND METHODS OF MAKING THE SAME

(75) Inventors: Asif Khan, Irmo, SC (US); Vinod Adivarahan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 828 days.

(21) Appl. No.: 12/442,953

(22) PCT Filed: Nov. 13, 2007

(86) PCT No.: PCT/US2007/084520
§ 371 (c)(1),
(2), (4) Date: Apr. 7, 2010

(87) PCT Pub. No.: WO2008/061085
PCT Pub. Date: May 22, 2008

(65) Prior Publication Data
US 2010/0187545 A1  Jul. 29, 2010

Related U.S. Application Data

(60) Provisional application No. 60/858,276, filed on Nov. 10, 2006.

(51) Int. Cl.
*H01L 21/22* (2006.01)
*H01L 21/225* (2006.01)
*H01L 29/08* (2006.01)
*H01L 29/66* (2006.01)
(Continued)

(52) U.S. Cl.
CPC ..... *H01L 21/2258* (2013.01); *Y10T 428/24802* (2015.01); *H01L 29/0847* (2013.01); *H01L 29/0891* (2013.01); *H01L 29/2003* (2013.01); *H01L 29/66462* (2013.01); *H01L 29/7787* (2013.01); *H01L 33/025* (2013.01); *H01L 33/325* (2013.01)

(58) Field of Classification Search
CPC ... H01L 21/22; H01L 21/2225; H01L 21/225; H01L 21/2258; H01L 21/38; H01L 21/385; H01L 29/2003
USPC ......... 438/181, 232, 301, 306, 542, 558, 560, 438/563
See application file for complete search history.

(56) References Cited

U.S. PATENT DOCUMENTS

| | | |
|---|---|---|
| 4,470,192 A | 9/1984 | Miller |
| 5,192,987 A | 3/1993 | Khan et al. |

(Continued)

OTHER PUBLICATIONS

International Search Report for corresponding PCT Application No. PCT/US07/84520, 2 pgs, Apr. 2007.

(Continued)

*Primary Examiner* — Jay C Kim
(74) *Attorney, Agent, or Firm* — Dority & Manning, P.A.

(57) ABSTRACT

The present invention is generally directed to methods of selectively doping a substrate and the resulting selectively doped substrates. The methods include doping an epilayer of a substrate with the selected doping material to adjust the conductivity of either the epilayers grown over a substrate or the substrate itself. The methods utilize lithography to control the location of the doped regions on the substrate. The process steps can be repeated to form a cyclic method of selectively doping different areas of the substrate with the same or different doping materials to further adjust the properties of the resulting substrate.

5 Claims, 10 Drawing Sheets

(51) Int. Cl.
*H01L 29/778* (2006.01)
*H01L 29/20* (2006.01)
*H01L 33/02* (2010.01)
*H01L 33/32* (2010.01)

(56) References Cited

U.S. PATENT DOCUMENTS

| | | | |
|---|---|---|---|
| 6,441,393 B2 | 8/2002 | Goetz et al. | |
| 6,690,042 B2 | 2/2004 | Khan et al. | |
| 6,764,888 B2 | 7/2004 | Khan et al. | |
| 7,419,892 B2 * | 9/2008 | Sheppard et al. | 438/522 |
| 7,439,609 B2 * | 10/2008 | Negley | 257/615 |
| 8,372,697 B2 | 2/2013 | Khan et al. | |
| 2002/0078881 A1 | 6/2002 | Cuomo et al. | |
| 2002/0155670 A1 | 10/2002 | Malik | |
| 2003/0020104 A1 | 1/2003 | Talin et al. | |
| 2004/0142557 A1 | 7/2004 | Levy et al. | |
| 2008/0132047 A1 * | 6/2008 | Dunne et al. | 438/527 |

OTHER PUBLICATIONS

Adivarahan et al., "Stable CW Operation of Field-Plated GaN—AlGaN MOSHFETs at 19 W/mm". IEEE Elec. Dev. Lett., vol. 26, Issue 8, 535-537, 2005.

Fareed et al., "Vertically Faceted Lateral Overgrowth of GaN on SiC with Conducting Buffer Layers Using Pulsed Metalorganic Chemical Vapor Deposition". Appl. Phys. Lett. 77, No. 15, 2343-2345, Oct. 9, 2000.

Irokawa et al., "Activation characteristics of ion-implanted $Si^+$ in AlGaN". Appl. Phys. Lett. 86, 192102, 2005.

Qiao et al., "Low resistance ohmic contacts on AlGaN/GaN structures using implantation and the "advancing" Al/Ti metallization". Appl. Phys. Lett. vol. 74, No. 18, May 1999.

Simin et al., "AlGaN/InGaN/GaN Double Heterostructure Field-Effect Transistor". Jpn. J. Appl. Phys., vol. 40 No. 11A, L1142-L1144, 2001.

Simin et al., "SiO2/AlGaN/InGaN/GaN Metal-Oxide-Semiconductor Double Heterostructure Field-Effect Transistors", IEEE Elec. Dev. Lett., vol. 23 No. 8, 458-460, 2002.

Winslow et al., "Principles of Large Signal MESFET Operation", IEEE Trans. Microwave. Theory Tech., vol. 42, 935-942, 1994.

Wu et al., "30-W/mm GaN HEMTs by Field Plate Optimization", IEEE Elec. Dev. Lett., V. 25, 117-119, 2004.

\* cited by examiner

SELECTIVELY DOPED SEMI-CONDUCTORS AND METHODS OF MAKING THE SAME

PRIORITY INFORMATION

The present application claims priority to U.S. Provisional Patent Application No. 60/858,276 filed on Nov. 10, 2006, naming M. Asif Khan and Vinod Adivarahan as inventors, which is incorporated by reference herein in its entirety.

GOVERNMENT SUPPORT CLAUSE

The present invention was developed with funding from the Defense Advanced Research Project Agency under grant number 4488. The government retains certain rights in the invention.

BACKGROUND OF THE INVENTION

Wide bandgap semiconductor materials (with Eg>2 eV) such as silicon carbide (SiC) or Group III nitride compound semiconductors (e.g., gallium nitride GaN) are very attractive for use in high-power, high-temperature, and/or radiation resistant electronics. SiC power rectifiers and RF transistors are now commercially available, and SiC power switches as well as GaN microwave transistors are expected to appear in the commercial market in the near future.

Under the present circumstances, more compact semiconductor devices with lower losses are preferable in order to meet future demands for higher power. Group III nitrides are widely known to emit light ranging from UV to the visible spectra. Many group III nitrides, therefore, show potential as opto-electronic light sources and high frequency power devices. Although group III nitrides have been shown to be useful in opto-electronic light sources and high frequency power devices, a need exists to make smaller and more powerful devices from group III nitrides to meet the increasingly difficult demands from the resulting devices' performance.

One method of controlling the performance of the device is by doping at least one layer of the substrate, specifically the group III nitride epilayer. In the past, D. Qiao et. al [D. Qiao, Z. F. Guan, J. Carlton, and S. S. Lau and G. J. Sullivan, "Low resistance ohmic contacts on AlGaN/GaN structures using implantation and the "advancing" Al/Ti metallization", Appl. Phys. Lett., Vol. 74, No. 18, May 1999] and Y. Irokawa et. al [Y. Irokawa, O. Fujishima, T. Kachi, S. J. Pearton and F. Ren, "Activation characteristics of ion-implanted $Si^+$ in AlGaN", Appl. Phys. Lett. 86, 192102 2005] have demonstrated doping of AlGaN epilayers by ion implantation. However, these processes required a high temperature (greater than 1100° C.) annealing to reduce the implantation induced defects. The annealing conditions depend strongly on the dose and energy of implantation.

Thus, a need exists for a doping process that avoids the potential damage caused by implantation and requires only a moderate temperature annealing. Additionally, a need exists to remove the necessity of depositing encapsulation material to protect the surface from decomposition.

SUMMARY OF THE INVENTION

Objects and advantages of the invention will be set forth in part in the following description, or may be obvious from the description, or may be learned through practice of the invention.

The present invention is generally directed to selective doping of a substrate. As such, methods of forming a substrate having an epilayer that is selectively doped with a doping material that affects the conductivity of the epilayer are generally described.

In one embodiment, the method includes depositing a doping material directly on an epilayer (e.g., a group III nitride epilayer) of a substrate. A photo-resist layer is deposited directly on the doping material. A portion of the photo-resist layer can then removed, using lithography techniques for example, to expose the underlying doping material only in those removed portions. The substrate can then be etched to remove the photo-resist layer remaining on the substrate and the doping material exposed by the removed portions of the photo-resist layer. The etching results in the doping material remaining on the substrate corresponding to the location of the removed portions of the photo-resist layer. Finally, the substrate can be annealed to dope at least a portion of the remaining doping material into the epilayer.

This process can be repeated any number of times desired to create a cyclic selective doping process. For example, a second doping material can be deposited directly on the epilayer of the substrate having an epilayer that is selectively doped. Then, a second photo-resist layer can be deposited directly on the second doping material. A portion of the second photo-resist layer can then be removed to expose the underlying second doping material only in those removed portions. The substrate can then be etched to remove the second photo-resist layer remaining on the substrate and the second doping material exposed by the removed portions of the second photo-resist layer, resulting in the second doping material remaining on the substrate corresponding to the location of the removed portions of the second photo-resist layer. Finally, the substrate can be annealed to dope at least a portion of the remaining second doping material into the epilayer. These process steps can be repeated any number of times, such from 2 to about 100 times, to form the desired selectively doped substrate.

In another embodiment, the method includes depositing a photo-resist layer directly on an epilayer of a substrate. A portion of the photo-resist layer can be removed to expose the underlying epilayer only in those removed portions. A dielectric layer can then be deposited directly on the exposed epilayer and the remaining photo-resist layer at a temperature that is less than about 350° C. The remaining photo-resist layer and the dielectric layer overlying the photo-resist layer can be removed to leave only the dielectric layer that is directly deposited on the epilayer. Finally, the substrate can be annealed to dope at least a portion of the remaining dielectric layer into the epilayer.

This embodiment can also be used in a cyclic selective doping process. For example, a second photo-resist layer can be deposited directly on the epilayer. A portion of the second photo-resist layer can then be removed to expose the underlying epilayer only in those removed portions. A second dielectric layer can then be deposited directly on the exposed epilayer and the remaining second photo-resist layer at a temperature that is less than about 350° C. The remaining second photo-resist layer and the second dielectric layer overlying the second photo-resist layer can be removed to leave only the second dielectric layer that is directly deposited on the epilayer. Finally, the substrate can be annealed to dope at least a portion of the remaining second dielectric layer into the epilayer. These process steps can be repeated any number of times, such from 2 to about 100 times, to form the desired selectively doped substrate.

The doping material can be a dielectric material that increases the conductivity of the layer, such as deposited using a digital oxide deposition technique, a digital nitride deposition technique, or a combination thereof. Alternatively, the doping material can be carbon, iron, or a combination thereof to create a doped epilayer having reduced conductivity.

The annealing of the substrate to dope at least a portion of the remaining dielectric layer into the epilayer can result in less than 100% of the doping material migrating into the epilayer, such as from about 10% to about 50%. In one embodiment, the undoped portion of the doping material can be removed after annealing.

The annealing of the substrate to dope at least a portion of the remaining doping material into the epilayer can be accomplished through continuous annealing the substrate at a temperature between about 300° C. and about 1,200° C. for a time ranging from about 1 second to about 72 hours, such as continuous annealing the substrate at a temperature between about 650° C. and 1,000° C. for a period ranging from about 30 seconds to about 10 minutes.

In yet another embodiment, the present invention is generally directed to a selectively doped substrate formed according to any of the methods presently described. The selectively doped substrate can have a conductivity ranging from about 1 ohm/sq to about 50,000 ohms/sq. The substrate can be utilized to form a light emitting diode or a transistor.

Other features and aspects of the present invention are discussed in greater detail below.

BRIEF DESCRIPTION OF THE FIGURES

A full and enabling disclosure of the present invention, including the best mode thereof to one skilled in the art, is set forth more particularly in the remainder of the specification, which includes reference to the accompanying figures, in which.

Figure 1:
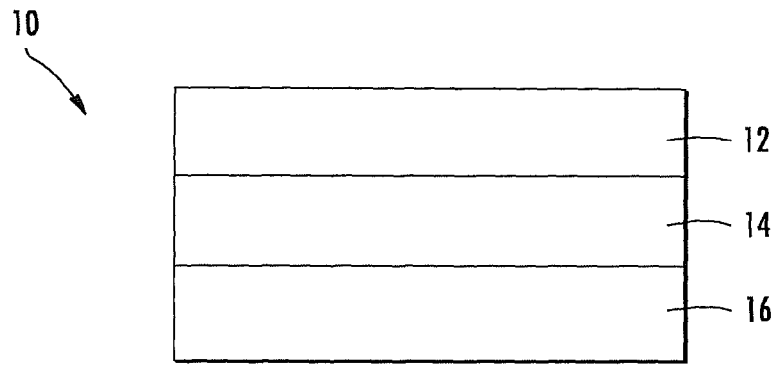
FIG. 1 shows an exemplary substrate having a group III nitride epilayer.

Repeat use of reference characters in the present specification and drawings is intended to represent the same or analogous features or elements of the present invention.

DETAILED DESCRIPTION OF THE PREFERRED EMBODIMENTS

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Generally speaking, the present invention is directed to the selective doping of an epilayer of a substrate or the substrate itself. The present invention is particularly well suited for use in nitride-based devices, such as group III-nitride based devices. Although the present invention is not specifically limited to group III-nitride based devices, the following discussion focuses on group III-nitride based devices due to their particular compatibility with the present invention.

The following descriptions of selective doping processes allow for the manufacture of selectively doped group III nitride epilayers having controlled properties. For example, in one embodiment, the group III nitride epilayer can be doped with a material that increases the layer's conductivity. In this embodiment, a device formed from the doped (ex-situ doping) group III nitride epilayer having increased conductivity can exhibit higher power output at a given voltage than the undoped (or only in-situ doped) group III nitride epilayer. Alternatively, the group III nitride epilayer can be doped with a material that decreases conductivity of the group III nitride epilayer. Thus, by controlling of the conductivity of the group III nitride epilayer in select areas of the epilayer, the overall performance of the epilayer can be selectively controlled.

These methods can also be used to form excellent metallic (linear or ohmic) contacts with lower temperature, resulting in better morphology and avoiding metallic protrusion (whiskers), a common cause for breakdown of devices and leakage current. Due to the ease of forming (or defining) the ex-situ doped regions it is now possible to tailor the doping profiles and have graded doped regions that can be tailored for either high breakdown operations or high power operations. Unlike other doping methods, such as ion-implantation or high temperature diffusion processes (which tend to decompose the surfaces), the presently described ex-situ doping processes can be used to alter the semiconductor surfaces according to the device requirements and is not detrimental for device fabrication.

"Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds (e.g., AlGaN and AlInGaN) are particularly preferred. As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN).

The group III nitride epilayer can be composed of any combination of group III elements (e.g., Al, In, and Ga) and nitride. In one particular embodiment, the group III-nitride epilayer can be represented by the formula $Al_xIn_yGa_{1-x-y}N$, wherein $0<x\le1$, $0\le y\le1$ and $0<x+y\le1$. In employing growth techniques to grow the group III nitride epilayer, the precursor sources typically include a metal-organic source (e.g., trimethyl aluminum, trimethyl gallium, triethyl gallium, trimethyl indium), a nitrogen source (e.g., ammonia), a carrier gas (e.g., hydrogen and/or nitrogen), and an optionally doping source (e.g., silane, biscyclopentadienyl magnesium, etc.). Of course, other materials can be utilized to grow the group III nitride epilayer, and the present invention is not intended to be limited by the above listed materials. For example, another type of a metal-organic source and/or a nitrogen source can be utilized to grow the group III nitride epilayer.

The group III nitride epilayer can be applied on a substrate using any suitable technique, including but not limited to, metalorganic chemical vapor deposition (MOCVD), hydride vapor phase epitaxy (HVPE), molecular beam epitaxy (MBE), metalorganic hydride vapor phase epitaxy (MOHVPE), pulsed atomic layer epitaxy (PALE) growth technique, pulsed lateral overgrowth techniques (PLOG) (useful for growth of a group III nitride epilayer on a patterned wafer), or any combination of any of the deposition methods.

Pulse atomic layer epitaxy (PALE) allows accurate control of the quaternary layer composition and thickness by simply changing the number of aluminum, indium, and gallium pulses in a unit cell and the number of unit cell repeats. By controlling the pulse time, pulse condition, flow rate, and therefore chemical availability, the systematic growth provides a layer with significantly control of the composition, thickness and crystalline quality.

Pulsed lateral overgrowth (PLOG) is a technique wherein a Group III comprising material (e.g., triethyl gallium or trialkly aluminum) and a nitrogen material (e.g., ammonia) are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5, which is incorporate by reference herein. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

Referring to FIG. 1, an exemplary substrate (10) having a group III nitride epilayer (12) is generally shown. As shown, a buffer layer (14) is positioned between the group III nitride epilayer (12) and the base layer (16). Thus, the group III nitride epilayer (14) is applied adjacent to the buffer layer (14) overlying the base layer (16). While the exemplary substrate (10) is shown having only 3 layers, it should be understood that any substrate having a group III nitride epilayer can be subjected to the processes presently described. Thus, the particular substrate is not intended to be limited by the examples described herein.

Generally, the buffer layer (14) is used to accommodate for the large lattice and thermal mismatch between the group III nitride epilayer (12) and the base layer (16). The buffer layer (14) can be made of a Group III-Nitride material, such as $Al_xIn_yGa_{1-x-y}N$, wherein $0<x\le1$, $0\le y<1$, and $0<x+y\le1$), using at least one of the following techniques: MOCVD, HYPE, MOHVPE, PALE, PLOG, or any combination of any of the deposition methods. For example, thin AlN buffer layers can be used to absorb the lattice mismatch between the GaN film and a Si substrate. Alternatively, AlGaN layers can be used as templates for the growth of GaN on a Si substrate. However, any suitable buffer layer (14) can be used in accordance with the present invention.

According to the present invention, the group III nitride epilayer to be selectively doped can be formed on any suitable base layer (16). Suitable base layers (16) include, but are not limited to, sapphire, silicon carbide, lithium aluminate, spinel, gallium nitride, aluminum nitride, aluminum gallium nitride, indium gallium nitride, aluminum indium gallium nitride, and the like. Of course, any suitable substrate can be used as the base layer (16) to grow the group III nitride epilayer. These substrates include polar (e.g., c-plane) or non-polar (e.g., a-plane, r-plane, or m-plane) or semi-polar substrates and epilayers.

After the formation of a group III nitride epilayer (12) of the substrate (10), the group III nitride epilayer (12) can be selectively doped with any suitable material to adjust the conductivity of the substrate as desired. This doping of the group III nitride epilayer can be achieved by either of two methods, both of which are described in greater detail below.

I. Selective Doping of Group III Nitride Epilayers Utilizing Etching

Figure 2:
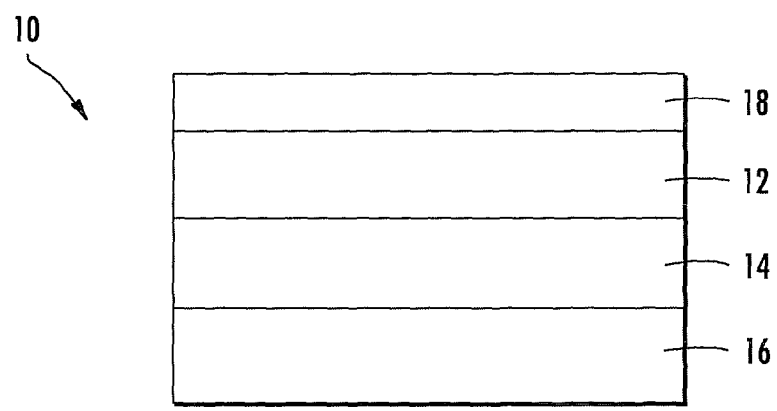
FIGS. 2-7 sequentially show intermediate substrates formed via the selective doping process embodiment utilizing etching.

In this embodiment, the group III nitride epilayer can be doped through the use of relatively simple process steps. These process steps result in several intermediate substrates shown sequentially in FIGS. 2-7 and resulting in the selectively doped substrate shown in FIG. 8. Starting with an exposed group III nitride epilayer (12) on the substrate (10), a dielectric layer (18) is grown over the group III nitride epilayer (12), such as shown in FIG. 2.

In one particular embodiment, the dielectric layer is formed from silicon oxide or a silicon nitride through a Digital Dielectric Deposition (DDD) technique. The DDD process can also be described as digital oxide deposition (DOD) and/or digital nitride deposition (DND). The DDD process is described in U.S. patent application Ser. No. 11/800,712 of Khan, et al., filed on May 7, 2007, which is incorporated by reference herein.

Generally, the DOD process involves alternating the application of silicon and oxygen (or a nitrogen source) to the substrate in a PECVD growth chamber to form a silicon dioxide dielectric layer. Accordingly, the silicon source and the oxygen source are applied independently from each other. For example, the substrate is first exposed to the silicon source gas, without any oxygen source present. Following purging of the silicon source gas (e.g., through a vacuum and/or purge gas), the substrate is exposed to the oxygen source gas, without any silicon source present. However, the order of exposure to the source gases can be altered such that the substrate is first exposed to the oxygen source, without any silicon source present, followed by the silicon source without any oxygen source present. In typical embodiments, the RF power of the PECVD chamber during the deposition process is from about 5 W to about 300 W.

In each DOD cycle, a silicon source and an oxygen source are each individually and sequentially applied to the substrate. Together, these individual applications form a thin layer of silicon dioxide on the surface of the substrate. The amount of silicon and oxygen applied per cycle can be controlled in a variety of ways in a conventional PECVD chamber, including but not limited to, the composition of the source gas, the concentration of the source gas, the length of exposure for each pulse of source gas, the total flow of the source gas per pus as regulated by a mass flow controller, and the temperature of the source gas and/or substrate.

However, the silicon source gas and the oxygen or nitrogen source gas do not have to be applied sequentially and independently, but can be applied with overlapping pulses such that the oxygen or nitrogen source are pulsed while the silicon source is either continuously injected into the deposition chamber or is pulsed such that an overlap in time exists between the silicon and oxygen or nitrogen pulse. Thus, there may exist in each DOD or DND cycle some time by which the silicon source is injected into the deposition chamber when the oxygen or nitrogen source are not injected into the deposition chamber to facilitate the surface mobility of the silicon source gas that is referred to in the previous embodiment.

The resulting thickness of each cycle of alternating silicon source and oxygen source typically results in a deposition layer having a thickness of less than about 5 nanometers, such as from about 0.5 to about 3 nm, and in some embodiments, between about 1 to about 2 nanometers, such as from about 1 to about 1.5 nanometers. Thus, the thickness of the entire deposition layer can be controlled by the number of cycles performed. As a result, any desired thickness of the deposition layer can be achieved by regulating the number of cycles performed on the substrate. In some embodiments, the thickness of the resulting dielectric layer (18) can range from about 50 angstroms (Å) to about 250 Å, such as from about 100 Å to about 200 Å.

The source gases are applied to the substrate in a chamber at a controlled temperature. Controlling the temperature of the chamber can allow control of the amount and thickness of each deposited layer. Typically, the temperature range of the chamber ranges from about 65° C. to about 350° C., such as from about 150° C. to about 325° C. In certain embodiments, the temperature within the chamber can be from about 200° C. to about 300° C., and in some embodiment, from about 225° C. to about 275° C. In yet another embodiment, the temperature within the chamber can be from about 65° C. to about 190° C. The temperature on the surface of the substrate generally follows the temperature of the chamber.

The silicon for the dielectric layer can be provided from any suitable silicon source. Typically, in PECVD chambers, the silicon source is provided in gaseous state. Suitable silicon source gases include, without limitation, silane gas ($SiH_4$), disilane ($Si_2H_6$), diethlysilane (DES), tetraethyl-ortho-silicate (TEOS), chlorosilane compounds, or mixtures thereof. Chlorosilane compounds can include, for example, dichlorosilane ($Si_2Cl_2H_2$), hexachlorosilane ($Si_2Cl_6$), silicon tetrachloride ($SiCl_4$), chlorosilane ($SiClH_3$), trichlorosilane ($SiCl_3H$), or combinations thereof. In addition to the silicon source, the silicon source gas can include other, non-oxidizing additives. For example, a reducing agent can be included in the silicon source gas. Reducing agents can facilitate the deposition of silicon on the surface of the substrate. Common reducing agents include, but are not limited to, hydrogen ($H_2$) gas, nitrogen ($N_2$), and inert gases such as helium (He) and argon (Ar). Alternatively, the silicon source gas can be composed only of (or essentially only of) the silicon source.

Likewise, the oxygen for the dielectric layer can be provided from any suitable oxygen source. Typically, in chambers, the oxygen source is provided in gaseous state. Suitable oxygen source gases include, without limitation, oxygen gas ($O_2$), nitrous oxide ($N_2O$), ozone ($O_3$), water vapor ($H_2O$), or mixtures thereof. In some embodiments, the oxygen source gas can be composed only of (or essentially only of) the oxygen source. Alternatively, the oxygen source gas can also include reducing agents (e.g., $H_2$ and $N_2$) and/or inert gases (e.g., He and Ar).

Additionally, the amount of silicon and oxygen applied in each cycle can be controlled by the length of exposure of the source gases to the substrate. In each cycle, the silicon source gas and the oxygen source gas can be alternatively and independently exposed to the substrate for up to about a minute (i.e., 60 seconds). However, in most embodiments, a shorted period is all that will be required to produce a dielectric layer having a sufficient thickness. For example, the source gas can be exposed to the surface of the substrate for up to about 30 seconds, from about 0.1 seconds to about 10 seconds. In some particular embodiments, the pulse period for each source gas ranges from about 0.5 seconds to about 5 seconds, such as from about 1 second to about 3 seconds.

The respective pulses of the silicon source and the oxygen source can be controlled via a computerized system (i.e., digitally). As such, the amount of respective source gases applied to the substrate can be more precisely controlled, leading to greater control of the thickness of the resulting silicon dioxide layer(s).

No matter the amount or composition of the oxygen source gas applied to the substrate, the oxygen source is allowed to react with the silicon present on the surface of the substrate. Through this oxidation, the silicon deposited on the surface reacts with the oxygen source gas to form silicon dioxide. As stated, this layer of silicon dioxide formed from at least one cycle of alternating silicon and oxygen sources applied to the substrate, forms a dielectric layer on the substrate.

Although the above discussion references silicon dioxide, it should be understood that the reaction stoichiometry may be varied. As such, the dielectric layer may be formed from a silicon oxide material having the structure $Si_xO_y$, where x is an integer that is at least one (such as from 1 to 5) and y is a number from about 0.5 to about 6, such as from about 1 to about 5. Thus, the resulting dielectric layer may include other silicon oxide materials that vary in stoichiometry from $SiO_2$, but have similar properties.

In one embodiment, a nitrogen source can be substituted for or added to the oxygen source. Thus, the resulting dielectric layer can include silicon nitride molecules, such as $SiN_2$ or a stiochiometric variance thereof. For example, the silicon nitride can have the formula $Si_uN_v$, where $1<u\leq5$ and $2\leq v\leq8$. Thus, the dielectric layer can include either silicon oxide or silicon nitride molecules, or a combination of the two. For example, silicon oxynitride is also a suitable dielectric material (typically SiON, but can also include $Si_uO_yN_v$, where $1<u<5$, $1<y<10$, and $1<v<10$).

Figure 3:
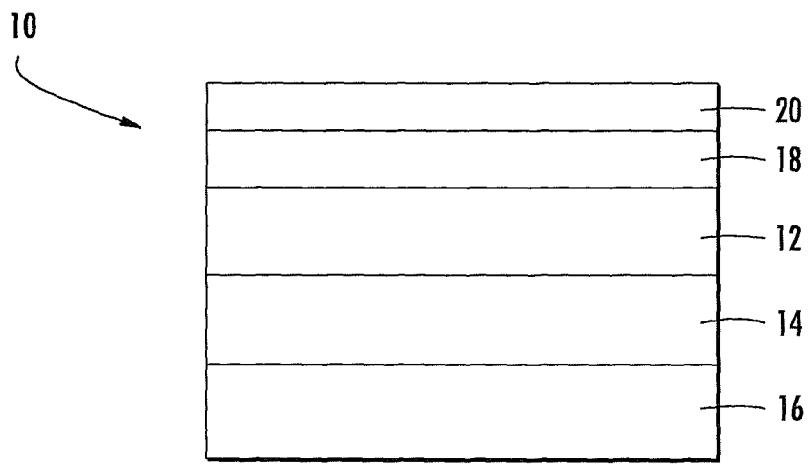
Figure 4:
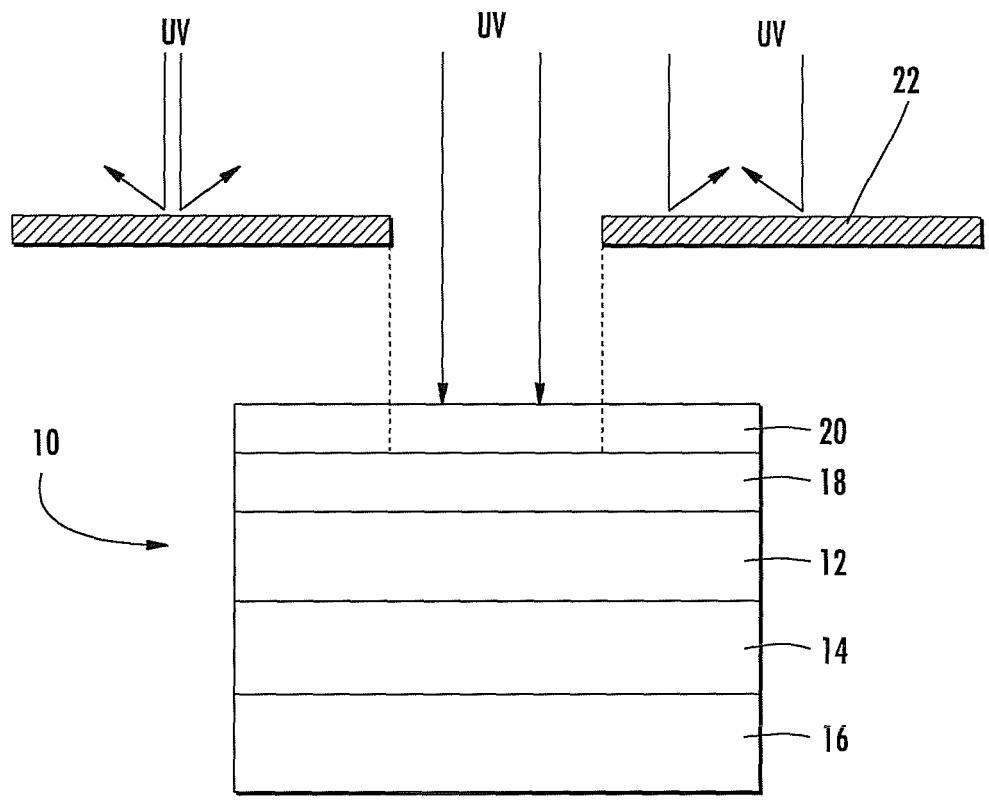

No matter the application method, the dielectric layer (18) is uniformly applied over the group III nitride epilayer (12). Then, select area(s) of the dielectric layer (18) are removed from the substrate (10) using lithography techniques. In one embodiment, a photo-resist coating (20) is applied uniformly over the dielectric layer (18), such as shown in FIG. 3. The photo-resist coating (20) can generally be composed of three basic elements: a base or resin, a solvent, and a polymer. As is well known in the art, exposing such photo-resist layers to ultra-violet radiation (e.g., wavelengths around 365 nm), the polymer properties can be substantially changed and/or altered.

In a general process of applying the photo-resist coating (20), the substrate (10) is initially heated to a temperature sufficient to drive off any moisture that may be present on the surface. A liquid or gaseous "adhesion promoter", such as hexamethyldisilazane (HMDS), can then be applied to promote adhesion of the photo-resist coating (20) to the substrate (10). The photo-resist coating (20) can be applied by spin-coating on a spinner. As is known in the art, spin-coating involves dispensing a viscous, liquid solution of photoresist onto the substrate (10), followed by spinning the substrate (10) to produce a substantially uniform photo-resist layer (20). The spin coating typically runs at 1200 to 4800 rpm for 30 to 60 seconds, and produces a layer between 2.5 and 0.5 micrometers thick. After application of the photo-resist layer (20), the substrate (10) can then be "soft-baked" or "prebaked" to drive off excess solvent, typically at 90 to 100° C. for 5 to 30 minutes. An oven or a hot-plate can be used.

Then, a mask may be placed over the photo-resist coating (20) overlying the dielectric layer (18) of the substrate (10) such that select portions of the photo-resist coating (20) are exposed, while other portions of the photo-resist coating (20) are shielded by the mask. These shielded areas of the photo-resist coating (20) will ultimately correspond to the areas doped by the dielectric layer (18) in the group III nitride epilayer (12). After positioning the mask over the substrate (10), the mask and substrate combination is irradiated with an energy source (e.g., ultraviolet light). In its basic form, the "mask" serves to shield at least one area or section of the substrate from the irradiating energy source and to expose at least one adjacent section to the energy source. For example, the mask may be a generally transparent or translucent blank (e.g., a strip of material) having any pattern of shielded regions printed or otherwise defined thereon. The transparent/translucent, unshielded regions of the mask correspond to the exposed areas of the substrate member. Alternatively, the mask may simply be an object or objects placed over the substrate. Regardless of the particular type of mask utilized, it should be understood that any pattern can be utilized to form the desired selectively doped regions.

The energy source may be, for example, a light source, e.g., an ultraviolet (UV) light source, an electron beam, a radiation source, etc. In a "positive" photo-resist coating (20), the energy source irradiates the exposed areas of the photo-resist coating (20) such that these portions can be removed from the substrate (10) to expose the underlying dielectric layer (18) in those selected areas. For example, referring to FIG. 4, a mask (22) is shown shielding portions of the photo-resist coating (20), while leaving the center portion of the photo-resist coating (20) exposed. Thus, when the energy source (represented by UV light) is applied to the masked substrate (10), the energy source (UV) only contacts the exposed center area of the photo-resist coating (20).

In this positive photo-resist coating (20), the energy source activates the exposed areas of the photo-resist coating (20) so that these activated areas can be removed. More specifically, the energy source causes a chemical change that allows that portion of the photo-resist layer (20) to be removed by a special solution, referred to as a "developer". In one embodiment, a metal-ion-free developer, such as tetramethylammonium hydroxide (TMAH), can be used to remove the activated portion of the photo-resist layer (20).

Alternatively, a "negative" photo-resist coating (20) can be utilized in accordance with the present invention. In this negative photo-resist coating (20), the energy source irradiates the exposed areas of the photo-resist coating (20) such that these portions become more robust, and less susceptible to removal from the substrate (10). Thus, the inactivated portions of the negative photo-resist coating (20) can be removed to expose the underlying dielectric layer (18) in those selected areas.

Once the select areas of the photo-resist coating (20) are removed, the underlying dielectric layer (18) is exposed in those select areas. For example, referring to FIG. 5, the center portion of the dielectric layer (18) is exposed, while the portions of the photo-resist coating (20) that were shielded by the mask (22) remain overlying the dielectric layer (18).

Figure 5:
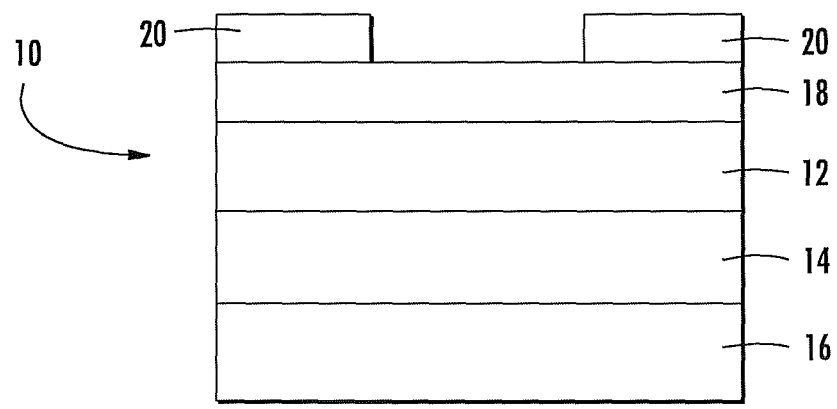

Finally, the substrate (10) of FIG. 5, with the dielectric layer (18) exposed in select areas and with the photo-resist coating (20) overlying the dielectric layer (18) in other areas, is subjected to an etching process to remove the remaining photo-resist coating (20) and to remove the exposed dielectric layer (18) from the substrate (10).

Generally, etching can be performed by either of two methods known in the art: (a) dry etching or (b) wet etching. In the dry etching technique, a reactive ion bombardment of chemical species are used to impinge on the surface with high energy. The chemical species can be, for example, fluorine ions from sources such as silicon hexafluoride, carbon tetrafluoride, etc. Due to the collision and chemical reactions, the exposed material is either etched away or sputtered away. The same can be achieved by employing even higher power density of ion species by involving inductively coupled plasma techniques whereby a very high radio-frequency (RF) power source is utilized in conjunction with a reactive ion coil. In the wet etching, a chemical is used to react chemically with the exposed areas to remove the undesired portions. Typically, the chemical is either an acid (hydrofluoric acid) or a base.

After etching, the substrate (10) is left with the dielectric layer (18) only in the areas corresponding to those shielded from the energy source by the mask. Thus, the areas that were exposed to the energy source have no dielectric layer (18) remaining, leaving the group III nitride epilayer (12) exposed in those areas. For example, referring to FIG. 6, the substrate (10) is shown having the dielectric layer (18) remaining only in those areas corresponding to those shielded by the mask, while the center portion of the group III nitride epilayer (12) is exposed (corresponding to the area exposed to the energy source).

Figure 6:
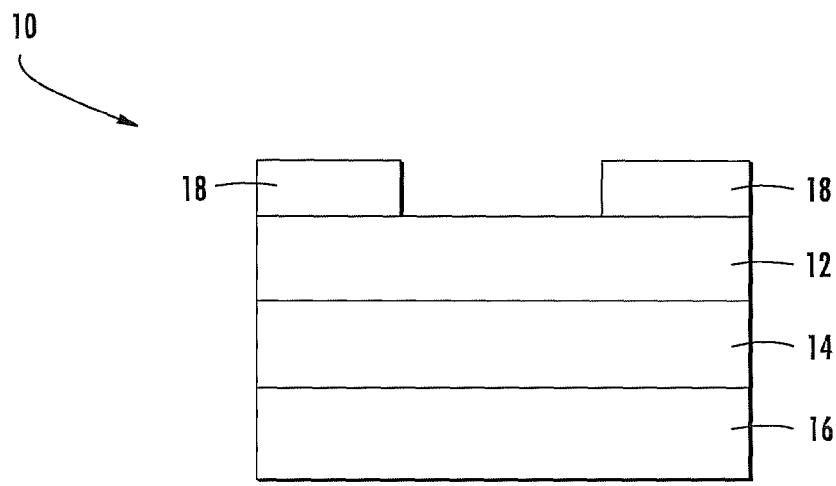

Finally, the substrate (10) having the dielectric layer (18) overlying the group III nitride epilayer (12) in selected areas, such as shown in FIG. 6, is subjected to an annealing process (e.g., continuous annealing, cyclic annealing, etc.). The annealing process subjects the substrate (10) to an elevated to a moderate or relatively high temperature for a period of time, which causes the remaining dielectric layer (18) to migrate into the group III nitride epilayer (12) to "dope" the group III nitride epilayer (12). Annealing can be performed using various ambients, including but not limited to, nitrogen, forming gas, argon, helium, oxygen, ammonia, or any such combinations.

In one embodiment, a rapid thermal annealing (RTA) process can be utilized to dope the group III nitride epilayer (12) with the remaining dielectric layer (18). The RTA process allows for the temperature of the RTA furnace to be increased quickly and subsequently cooled quickly. Thus, the time required for the substrate to be in the RTA furnace and the temperature to which the substrate is subjected can be more precisely controlled. Typically, the RTA system includes a plurality of halogen lamps inside a quartz lamp house. These lamps, upon heating with high filament current, produce heat, commonly referred to as radiation heating. Advantageously, through the use of RTA, any ambient gas can be utilized and the RTA system can be computerized to incorporate a set delay time. However, in some embodiments, other ovens or heating devices capable of reacting temperatures between about 150° C. and 2000° C. can be used, such as convection ovens or reactors (e.g., metal organic chemical vapor deposition systems).

Depending on the properties and composition of the substrate (10), e.g., the conductivity of the base layer (16), the buffer layer (14), the dielectric layer (18), and any other layers present in the substrate (10), the temperature and the length of time can be varied to control the amount of doping of the group III nitride epilayer (12) with the remaining dielectric layer (18). In most embodiments, the annealing process can be a continuous anneal between about 300° C. and about 1,200° C. for a time ranging from about 1 second to about 72 hours. For example, the continuous anneal can be performed between about 650° C. and 1,000° C. for a period ranging from about 30 seconds to about 10 minutes, such as from about 700° C. to about 900° C. for about 30 seconds to about 90 seconds.

The annealing process causes the remaining dielectric layer (18) to migrate into the group III nitride epilayer (12) to form doped regions in the group III nitride epilayer (12). The amount of doping of the group III nitride epilayer (12) can be controlled by the thickness of the dielectric layer (18), the composition of the dielectric layer (18), the porosity of the dielectric layer (18), and the temperature and length of the annealing process. However, in most embodiments, less than 100% of the dielectric layer (18) will migrate into the group III nitride epilayer (12) to form the doped regions. In one embodiment, from about 10% to about 50% of the thickness of the dielectric layer (18) can migrate into the group III nitride epilayer (12) to form the doped regions. For instance, if the thickness of the remaining dielectric layer (18) is about 200 Å prior to annealing, only about 50 Å to about 60 Å may migrate into the group III nitride epilayer (12) to form the doped regions.

Figure 7:
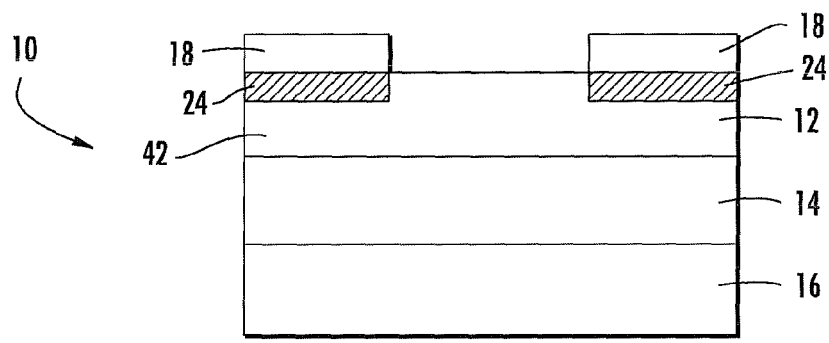
Figure 8:
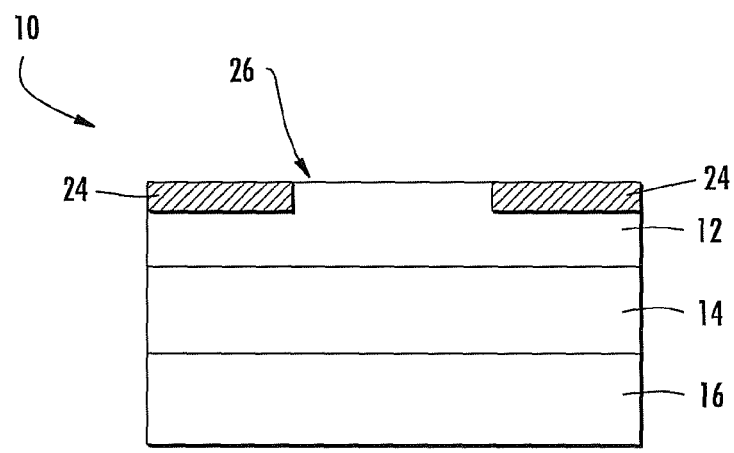
FIG. 8 shows an exemplary selectively doped substrate.

Referring to FIG. 7, the substrate (10) is shown after annealing. The remaining dielectric layer (18) migrated partially into the group III nitride epilayer (12) to form the doped regions (24). The excess dielectric layer (18) overlying the doped regions (24) of the group III nitride epilayer (12) can then be removed via etching to make a uniform surface (26), such as shown in FIG. 8. The resulting substrate (10), as shown in FIG. 8, has a uniform surface (26) of the group III nitride epilayer (12) that is selectively doped to adjust the performance of the substrate (10) as desired.

II. Selective Doping of Group III Nitride Epilayers Through Lift Off

In some embodiments, it can be advantageous to avoid the use of any etching process prior to the doping step because the etching process may damage the underlying layers (e.g., the group III nitride epilayer). The present inventors have discovered a process that enables the group III nitride epilayer to be doped without the need for an etching process. Accordingly, through the use of a lift off technique that takes advantage of the DDD process, etching processes can be avoided until after the group III nitride epilayer has been doped.

In this lift off method, the substrate shown in FIG. 1 is subjected to several process steps, resulting in the intermediate substrates (shown sequentially in FIGS. 9-13) to result in substantially the same intermediate substrate shown in FIG. 6, having the dielectric layer (18) remaining on the areas of the group III nitride epilayer (12) to be doped. After forming the intermediary substrate shown in FIG. 6, the process steps to get to the doped substrate of FIG. 8 are the same as described above.

Figure 9:
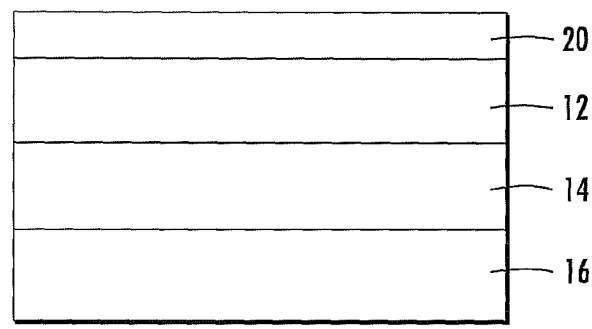
FIGS. 9-13 sequentially show intermediate substrates formed via the selective doping process embodiment utilizing lift off techniques.

In this embodiment, a photo-resist coating is first applied over the group III nitride epilayer (12) exposed on the substrate (10). Referring to FIG. 9, a photo-resist coating (20) is shown overlying the group III nitride epilayer (12) of the substrate (10).

Figure 10:
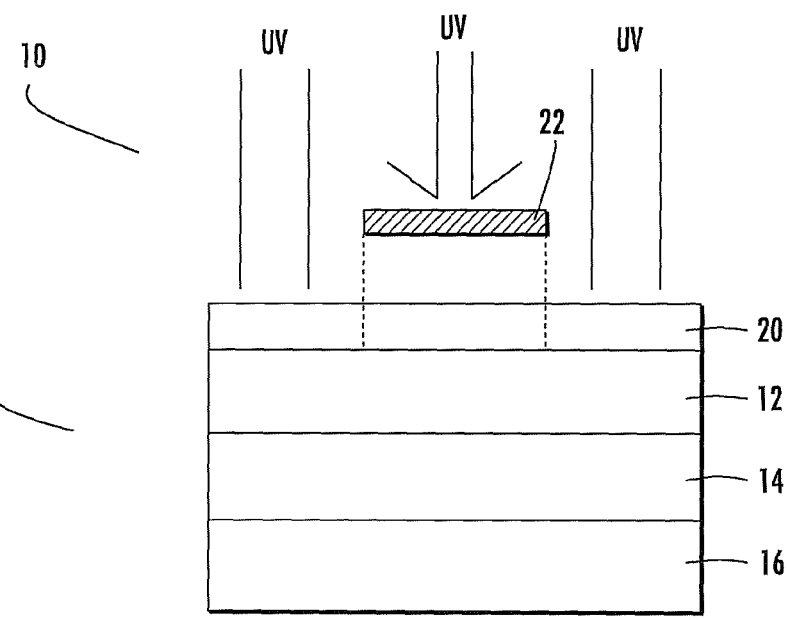

Next, a mask (22) is positioned over the photo-resist coating (20), as shown in FIG. 10. However, in this embodiment, the areas of the photo-resist coating (20) exposed by the mask (22) correspond to the areas that will ultimately be doped. Likewise, the areas of the photo-resist coating (20) shielded by the mask (22) correspond to those areas that will be free of any doping. An energy source (e.g., UV light) is applied to the mask (22) and substrate (10) combination to form activated areas that correspond to those areas to be doped.

Figure 11:
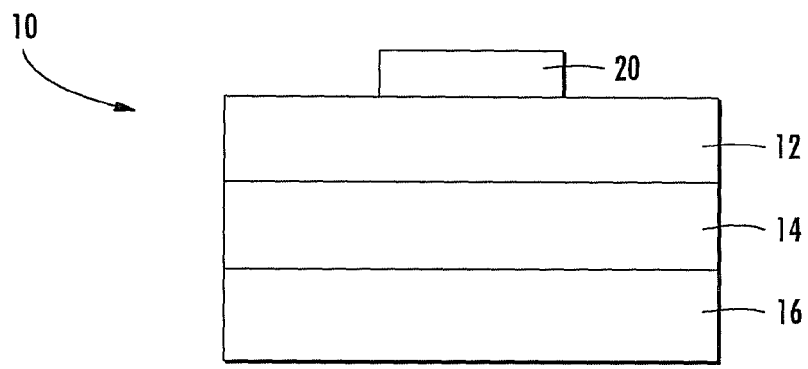

After exposure to the energy source, the activated areas of the photo-resist coating (20) are removed from the substrate (10) to leave exposed areas of the group III nitride epilayer (12), such as shown in FIG. 11. These exposed areas of the group III nitride epilayer (12) are the areas that will be doped.

Figure 12:
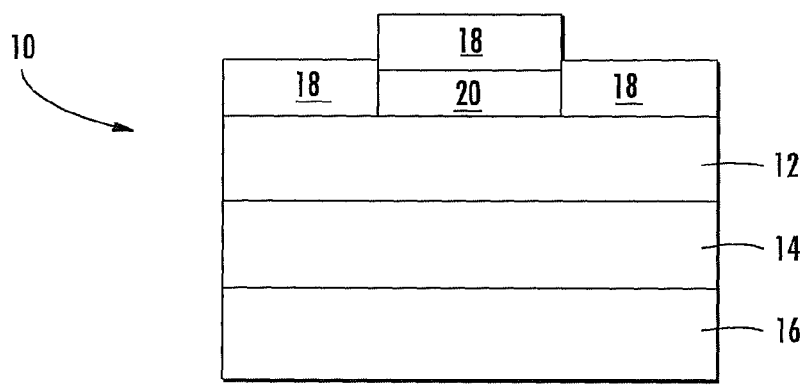

Following removal of the activated areas of the photo-resist coating (20), a dielectric layer (18) is grown to overly the exposed group III nitride epilayer (12) and the remaining photo-resist coating (20), as shown in FIG. 12. In order to grow the dielectric layer (18) without damaging the remaining photo-resist coating (20), a DDD process is utilized because this process can be performed at relatively low temperatures. Other deposition processes require a relatively high deposition temperature which would most likely bake and damage (e.g., crack, remove, carbonize, etc.) the remaining photo-resist coating (20), probably rendering the photo-resist coating (20) ineffective. For example, the dielectric layer (18) can be applied over the group III nitride epilayer (12) and remaining photo-resist coating (20) at a temperature of less than about 500° C., such as less than about 300° C., and in some embodiments less than about 150° C.

Figure 13:
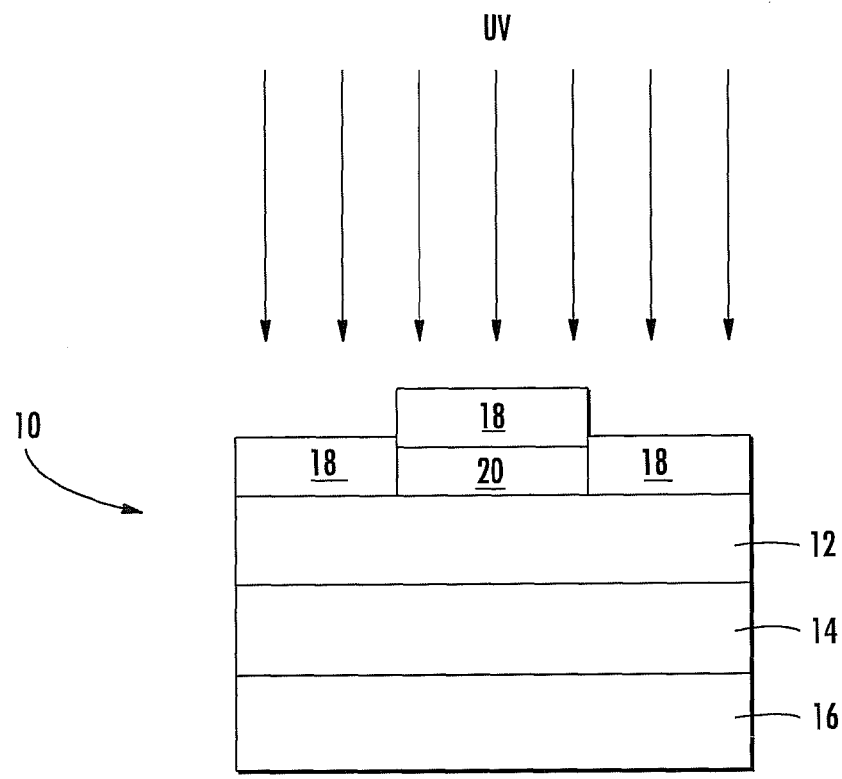

Finally, an energy source can be applied to the entire substrate (10) to activate all of the remaining photo-resist coating (20), as shown in FIG. 13. Thus, the remaining photo-resist coating (20) positioned between the group III nitride epilayer (12) and the dielectric layer (18) becomes activated. The activated photo-resist coating (20) and the dielectric layer (18) overlying it can then be removed through the use of a removal solution. As a result, only the dielectric layer (18) that was applied directly to the exposed group III nitride epilayer (12) remains on the substrate (10), as shown in FIG. 6.

III. Cyclic Selective Doping

No matter which of the above processes are utilized to produce the selectively doped substrate, the process can be repeated any number of times to produce a substrate having the desired characteristics. In each cycle, the same or different material can be doped into the group III nitride epilayer in order to refine the performance of the resulting substrate. This cyclic annealing can be performed by using the same dielectric layers or different dielectric layers with the same and/or different annealing conditions.

IV. Selective Doping of Group III Nitride Epilayers with Iron and/or Carbon

Instead of doping a more conductive material (such as a dielectric layer of silicon oxide) into the group III nitride epilayer, the substrate could be doped with a less conductive material using substantially the same processes. For example, a material composed of iron and/or carbon can be doped into the group III nitride epilayer. It should be understood, that the doping of a less conductive material into the group III nitride epilayer of the substrate can be performed either alone or as part of a cyclic selective doping process that incorporates doping other areas of the group III nitride epilayer with more conductive material.

In this embodiment, dielectric layer (18) as described above in section I is substituted with a nonconductive material (e.g., a carbon-iron material). The nonconductive material can be deposited using any of the techniques described above, except for the DDD process (which is not applicable to the application of a carbon-iron material).

Figure 14:
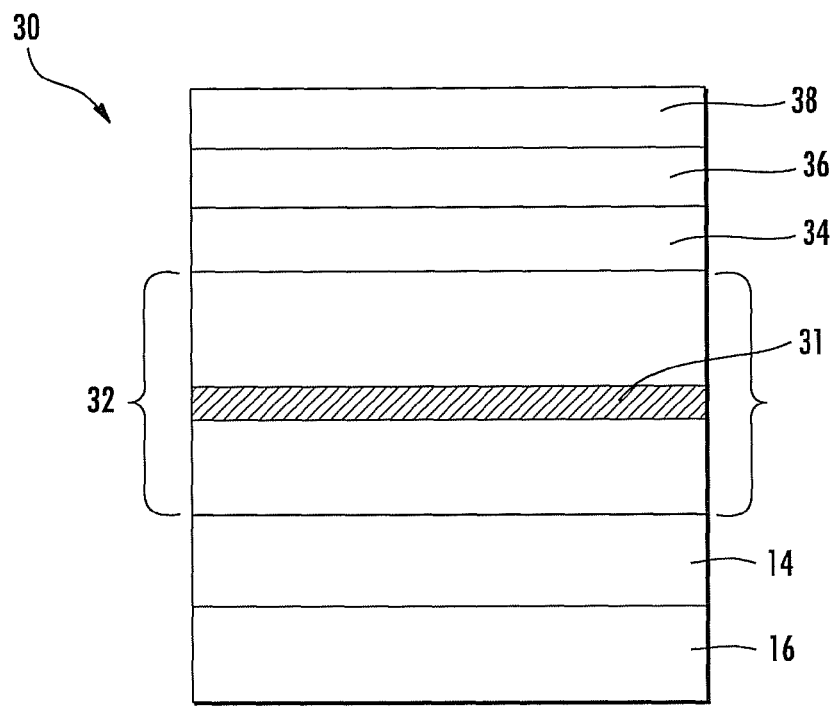
FIG. 14 shows an exemplary HEMT device is shown having an intrinsically doped group III nitride epilayer.

Thus, selective doping process of section I above can be used in a carbon-iron doping and regrowth method to produce a substrate having desired performance, such as for use in a HEMT device (which is described in greater detail below). In this carbon-iron doping and regrowth method, carbon-iron can be doped into a middle layer of the final HEMT device. For example, referring to FIG. 14, a HEMT device (30) is shown having an intrinsically doped group III nitride epilayer (32) overlying the buffer layer (14) and the base layer (16). A back barrier/well layer (34) is formed over the intrinsically doped group III nitride epilayer (32). A spacer layer (36) overlies the back barrier/well layer (34), and a group III nitride barrier layer (38) overlies the spacer layer (36).

The intrinsically doped group III nitride epilayer (32) has a doped region (31) of carbon-iron positioned within the interior of the intrinsically doped group III nitride epilayer (32). Although the doped region (31) is shown as a uniform layer, it is to be understood that this layer can be separated into select regions as discussed above.

In order to form the doped region (31) within the interior of the intrinsically doped group III nitride epilayer (32), the selective doping procedure is performed during the manufacture of the HEMT device (30). Specifically, after the intrinsically doped group III nitride epilayer (32) has been partially grown, the growth process is paused. During this pause, the selective doping process described above is performed to dope the desired materials (in this embodiment, carbon and/or iron) into the intrinsically doped group III nitride epilayer (32). Then, the growth process is renewed to complete the intrinsically doped group III nitride epilayer (32). As such, the doped material is formed in the interior of the intrinsically doped group III nitride epilayer (32) on the final HEMT device (30) formed.

V. Devices

Through the use of the selective doping methods described above, any of a variety of devices can be manufactured.

A. Heterostructure Field-Effect Transistors

The HEMT is a transistor which has a heterojunction formed between two semiconductor materials of different bandgaps. Current in such a device is confined to a very narrow channel at the junction, such current being known as a 2DEG (two dimensional electron gas). In one of the first developments of III-Nitride HEMT, U.S. Pat. No. 5,192,987 of Khan et al. discloses GaN/AlGaN based HEMTs grown on a buffer and a substrate. Significant improvement in performance of high power and high frequency electronic devices are seen during last 10 years. Novel structures such as AlGaN/GaN HEMT, AlGaN/InGaN/GaN double heterostructure, AlGaN/AlInGaN/InGaN/GaN THFET structures, HEMT structure with spacer layer have been made to improve the confinement of 2DEG and enhance the performance of devices. Small and large periphery devices have been reported with high powers more than 20 W/mm at 2-4 GHz. Previous MOSHFET devices design have improved some of the problem, inherent in these devices. However, this development is a combination of III-Nitride structure and fabrication improvement. The quality of the AlGaN barrier layer, deep quantum well channel layer are still a problem to improve gate leakage, current collapse, reliability and reproducibility of electronic devices.

However, the present inventors have discovered that the use of the selective doping processes described herein can address several of the problems of the prior devices. In one particular embodiment, the selective doping process can be utilized in the manufacture of heterostructure field-effect transistors (HFETs). AlGaN/GaN based HEMTs grown on a buffer and a substrate, and a methods for producing them, are disclosed in U.S. Pat. No. 5,192,987 to Khan et al., which is incorporated by reference herein. Other suitable HFETs are disclosed in U.S. Pat. Nos. 6,690,042 and 6,764,888 both issued to Khan, et al. on Feb. 10, 2004 and Jul. 20, 2004, respectively, the disclosures of which are herein incorporated by reference in their entirety.

Recently several groups have reported extremely high rf power densities, 20-30 W/mm, for AlGaN/GaN Heterostructure Field-Effect Transistors (HFETs). In addition to the high 2D channel electron densities specific to the AlGaN/GaN heterostructures, these high rf-power primarily resulted from the operation at drain voltages in excess of 50 V. The maximum output power of an RF amplifier, increases linearly with device peak current $I_M$ and operating voltage $V_B$. For example, in class 'A' mode, the maximum saturation RF power is given by Eq. (1):

$$P_{MAX} = \left(\frac{4}{\pi}\right)^2 \frac{I_M(V_B - V_{KN})}{4} \quad (1)$$

Here $V_{KN}$ is the knee voltage corresponding to the maximum saturation drain current $I_M$ and the factor $(4/\pi)^2$ accounts for the signal waveform at saturation. The Eq. (1) indirectly accounts for the RF dispersion (also referred to as the current collapse) if the dynamic values of $I_M$ and the $V_{KN}$ corresponding to device I-V characteristics "seen" by the rf-signals are used. The rf current collapse normally manifests itself as a reduction in the dynamic peak channel currents and an increase in the dynamic knee voltage (knee voltage walk-out). As seen from Eq. (1), the comparison of rf performance for different devices cannot be done solely based on the achieved output powers, especially in the presence of current collapse. The degradation of the device peak currents or knee voltage walk-out can be compensated by applying higher drain bias owing to high breakdown voltages achievable in III-N HFETs. Thus, the ratio of the maximum RF output power $P_{MAX}$ to the operating drain voltage $V_B$ is a more appropriate figure of merit, which we refer to as the power-voltage efficiency (PVE). From Eq. (2), PVE can be derived as:

$$PVE = \frac{P_{MAX}}{V_B} = \frac{4}{\pi^2} I_M \left(1 - \frac{V_{KN}}{V_B}\right) \quad (2)$$

Figure 18:
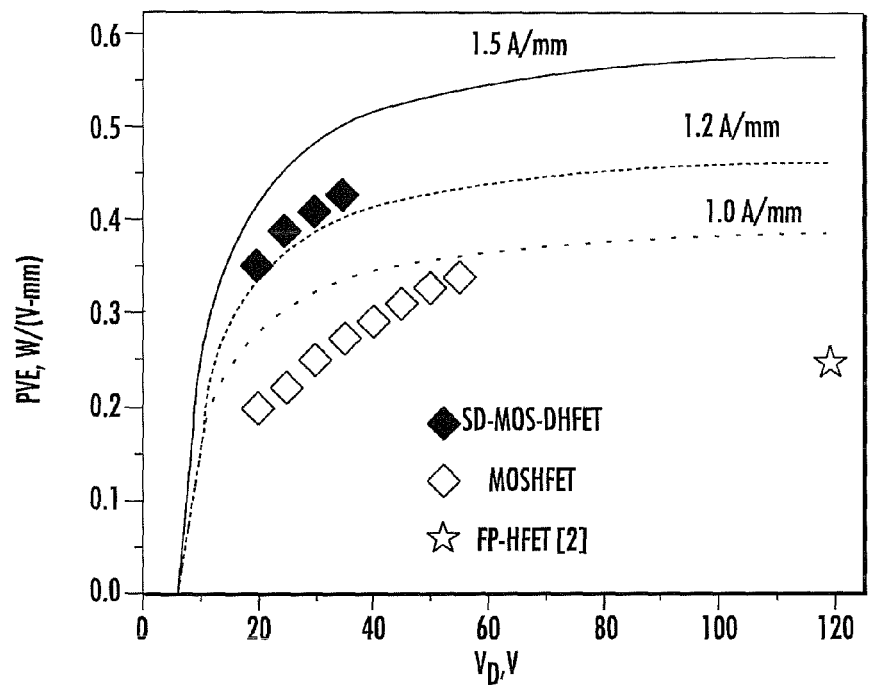
FIG. 18 shows the power-voltage efficiency of group III-Nitride HFETs (lines) calculated using Eq. (2)

The PVE factor describes the maximum rf power that can be obtained from a device at a given drain bias. As seen from Eq. (2), for a given bias voltage, the rf powers can be maximized by minimizing the dynamic $V_{KN}$ and/or maximizing the HFET peak drain currents $I_M$. The lines in FIG. 18 are the plots of the PVE values calculated from Eq. (2), for the HFETs with different peak currents. At low drain biases, the $V_{KN}$ value significantly affects the PVE, but at high drain biases $PVE \approx (4/\pi^2) I_M$ solely depending on the device peak currents.

Using the presently described selective doping methods, the present inventors have discovered a novel device design featuring high peak currents by utilizing a selective area doping of the source and drain access regions to significantly reduce the access resistances. Thus, the doped regions can be positioned in such a manner that the S-D electrodes are effectively formed on (e.g., adjacent to) these highly doped regions.

Figure 15:
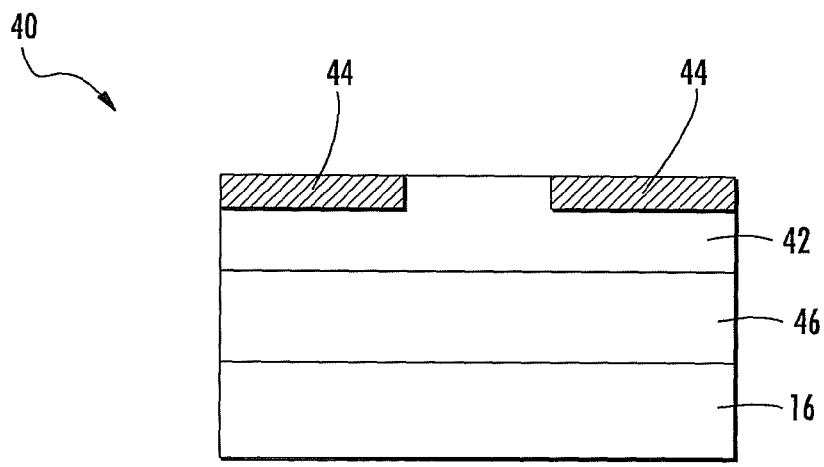
FIG. 15 shows an exemplary selectively doped substrate for use in a transistor.

The processes described above in sections I-III can be utilized on a transistor having additional layers than the simple exemplary substrate shown above. For example, referring to FIG. 15, a substrate (40) is shown having an upper layer (42), e.g., the group III nitride epilayer, with doped regions (44). The shown intermediate middle layer (46) is made of a single or a plurality of layers suitable for use in the substrate (40). Any suitable layer(s) or epilayer(s) known for use in electronic devices (e.g., transistors, switches, power amplifies, etc.), optoelectronic devices (e.g., LEDs, laser diodes, etc.), surface acoustic devices, photodetector devices, and the like can be used as the intermediate middle layer (46).

Figure 16:
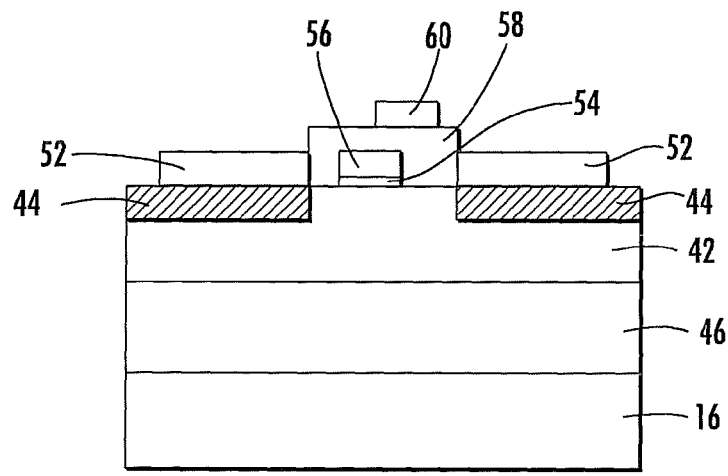
FIG. 16 shows an exemplary HEMT device that includes a selectively doped substrate.

To form the HEMT device, any suitable configuration can be used. For example, referring to the exemplary diagram of a HEMT device (50) of FIG. 16, the base layer (16) having the intermediate middle layer (46) and the upper layer (42) with the doped regions (44) is generally shown. S-D metal electrodes (52) are positioned above the upper layer (42). Likewise, a gate dielectric (54), such as formed using the DDD process described above, also overlies the upper layer (42). Overlying the gate dielectric (54) is the gate electronics (56). A SiN passivation (58) and the field plate electrode are also shown positioned on the transistor (50), as known in the art.

Using the presently described selective doping methods, the present inventors have discovered a novel device design featuring high peak currents by utilizing a selective area doping of the source and drain access regions to significantly reduce the access resistances. As such, the S-D metal electrodes (52) are shown to be located directly adjacent to the doped regions (44) of the upper layer (42).

B. Light Emitting Diodes (LEDs)

A light-emitting diode (LED) is generally a semiconductor diode that emits incoherent narrow-spectrum light when electrically biased in the forward direction of the p-n junction. Specifically, current flows from the p-side (i.e., the anode) to the n-side (i.e., the cathode) but not in the reverse direction. The color of the emitted light depends on the composition and condition of the semiconducting material used. It is well known to those skilled in the art that an active LED includes semiconducting materials doped with impurities to form a p-n junction. The wavelength of radiation is dependent on the band gap energy of the materials forming the p-n junction.

The selective doping processes described above can be used on substrates to form a light emitting structure, such as an LED device or a laser diode, having the desired characteristics. For example, the selective doping processes can be utilized to dope the device to alter the band gap energy of the materials forming the p-n junction, which can effect the resulting wavelength of the emitted light (i.e., the color of the light).

Although the semiconductor material is not particularly limited to group III devices, the advantages of the present invention are most readily appreciated in an LED based on group III nitrides. Preferably, the group III nitride compound is $Al_xIn_yGa_{1-x-y}N$, wherein $0<x\leq1$, $0\leq y\leq1$, $0<x+y\leq1$, and is optionally doped with a material to form a n-type or p-type semiconductor. Between the n-type and p-type is a quantum well and most preferably a multilayered quantum well which may or may not be doped. As discussed above, the group III nitride layer can be selectively doped to control the performance of the device.

In one particular embodiment, the n-type and/or p-type layers can be constructed of group III nitride (e.g., $Al_xIn_yGa_{1-x-y}N$, wherein $0<x\leq1$, $0\leq y\leq1$, $0<x+y\leq1$). Likewise the n-type and/or p-type layers can be selectively doped according to any of the processes described above.

Figure 17:
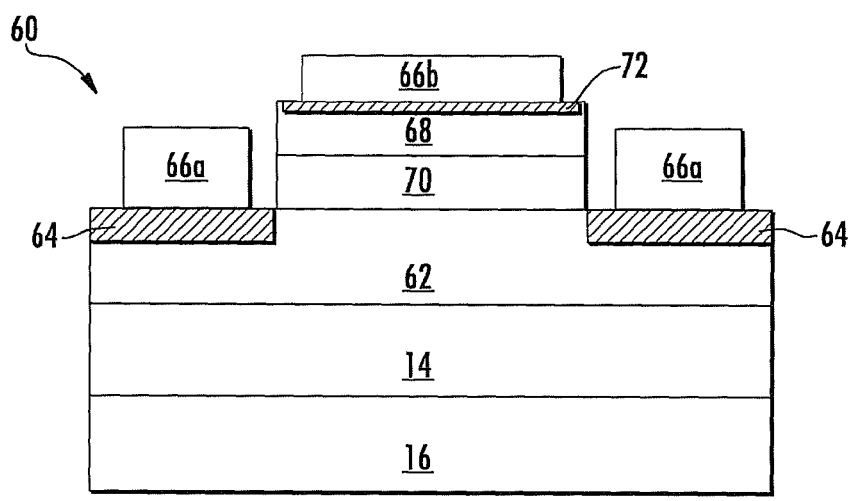
FIG. 17 shows an exemplary LED device that includes a selectively doped substrate.

For example, referring to FIG. 17, an exemplary LED device (60) is shown having selectively doped layers via any of the processes discussed above. In the LED device (60), a n-type layer (62) having selectively doped regions (64) is positioned over the base layer (16). An optional buffer layer (14) is shown positioned between the n-type layer (62) and the base layer (16), as is known in the art. The n-type layer 62 is shown having doped regions (64) positioned under the electrodes The doped regions (64) can be selectively doped according to any of the methods described above. In one particular embodiment, the n-type layer (62) is doped with silicon, silicon oxide, silicon nitride, and/or silicon oxynitride. In the shown embodiment, metal electrodes (66a) are positioned above the doped regions (64). This flexibility of doping the ohmic contact regions provides the necessary band-bending in the semiconductor, which then facilitates the electron transfer across the metal-semiconductor junctions thereby yielding the desired results with ease.

The p-type layer (68) is positioned over the n-type layer (62) having the optional multi-quantum well (MQW) layer (70) positioned between the n-type layer (62) and the p-type layer (68). As is known in the art, the MQW layer (70) can increase the efficiency of the LED device (60). As shown, the p-type layer (68) has doped regions (72) that can be doped according to any of the processes described above. In one particular embodiment, the p-type layer (68) can be selectively doped with magnesium (via magnesium oxide, metal-magnesium compounds, or any other magnesium source), zinc oxide, and/or indium tin oxide. This process again provides the necessary carriers (in this case the holes) to change the Fermi-level band positioning across the metal-semiconductor junction which helps in achieving the desired ohmic (linear) contacts. This is of great significance especially for p-type semiconductor, since the conductivity and mobility of holes as carriers is generally lower than electrons (in n-type doping).

EXAMPLE 1

HFET

A HFET was produced utilizing the selective doping process described above. To minimize the RF current collapse and achieve a stable RF operation, a field-plated insulated gate (MOSHFET) device design was employed. AlGaN—InGaN—GaN Double Heterostructure design (DHFET) first proposed in G. Simin, X. Hu, A. Tarakji, J. Zhang, A. Koudymov, S. Saygi, J. Yang, M. Asif Khan, M. S. Shur, and R. Gaska, "AlGaN/InGaN/GaN Double Heterostructure Field-Effect Transistor", Jpn. J. Appl. Phys., Vol. 40 No. 11A pp. L1142-L1144 (2001) and G. Simin, A. Koudymov, H. Fatima, J. Zhang, J. Yang, M. Asif Khan, X. Hu, A. Tarakji, R. Gaska and M. S. Shur, "SiO₂/AlGaN/InGaN/GaN Metal-Oxide-Semiconductor Double Heterostructure Field—Effect Transistors", IEEE Elec. Dev. Lett., V. 23 N8, 458-460 (2002), both of which are incorporated by reference herein, was used to improve the carrier confinement at high current density levels.

The AlGaN—InGaN—GaN double heterostructures was deposited using low pressure MOCVD on insulating SiC substrates. They consisted of a 0.1 µthick MEMOCVD deposited AlN buffer layer followed by a 1.2 µm thick undoped GaN layer. An approximately 50 Å thick InGaN channel was then grown to form the Double Heterostructure, using the method described in G. Simin, A. Koudymov, H. Fatima, J. Zhang, J. Yang, M. Asif Khan, X. Hu, A. Tarakji, R. Gaska and M. S. Shur, "SiO2/AlGaN/InGaN/GaN Metal-Oxide-Semiconductor Double Heterostructure Field—Effect Transistors", IEEE Elec. Dev. Lett., V. 23 N8, 458-460 (2002), which is incorporated by reference herein. This InGaN channel was capped with a 30 Å thick AlN spacer and a 180 Å thick unintentionally doped $Al_{0.3}Ga_{0.7}N$ barrier layer. The sheet resistivity of the heterostructure was 300-310 Ω/sq. After mesa formation by inductively coupled plasma etching, on a part of the wafer the source-gate and the gate-drain access regions were selectively doped by deposition of a thin layer of SiON followed by annealing at 850° C. for 1 minute.

Figure 19:
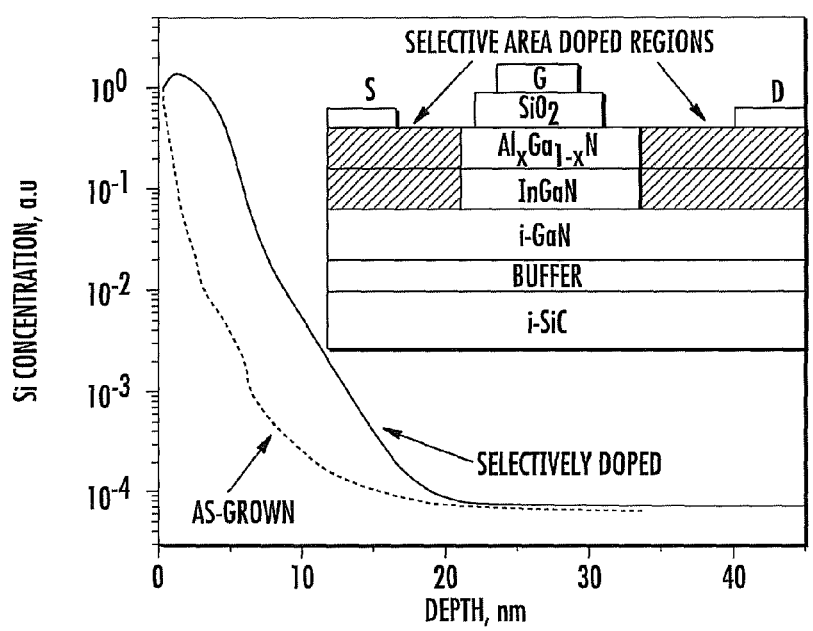
FIG. 19 shows normalised SIMS profiles of Si atomic concentration in the selectively doped and as-grown AlGaN/GaN samples. Curve "noisiness" at low concentration levels has been smoothened out. Although SIMS data does not provide accurate quantitative Si profiles, the absolute Si counts for selectively doped samples were significantly higher than those of as-grown.

FIG. 19 shows the silicon concentration SIMS profile taken after selective area doping; for comparison the profile for as-grown structure is also shown. Significant increase in the Si concentration in the barrier and the 2D channel region (around 20 nm below the surface) is evident.

Figure 20:
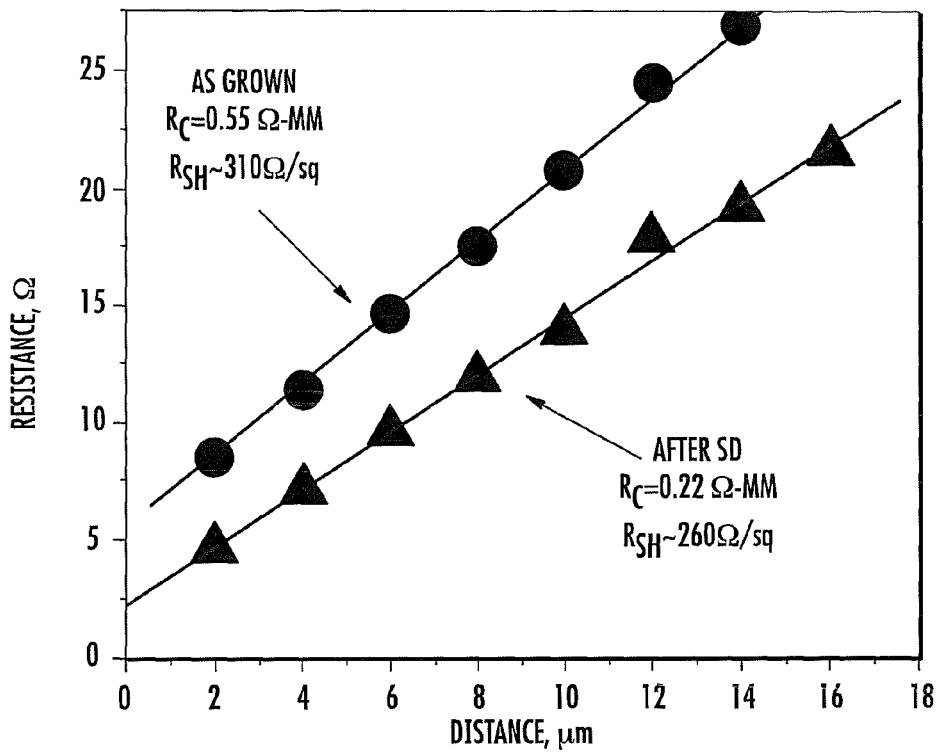
FIG. 20 shows TLM data comparison for a standard and selective area doped structures.

To see the effect of additional doping on the contact and sheet resistance we used standard transmission line pattern (TLM) measurements where the electrodes were 200 μm wide and the spacing ranged from 2 to 20 μm. As seen from the TLM data of FIG. 20, the selective area doping (SD) procedure resulted in a reduction of the sheet resistance from 300-310 Ω/sq to 260 Ω/sq and the contact resistance from 0.55 Ω-mm to 0.22 Ω-mm.

Figure 21:
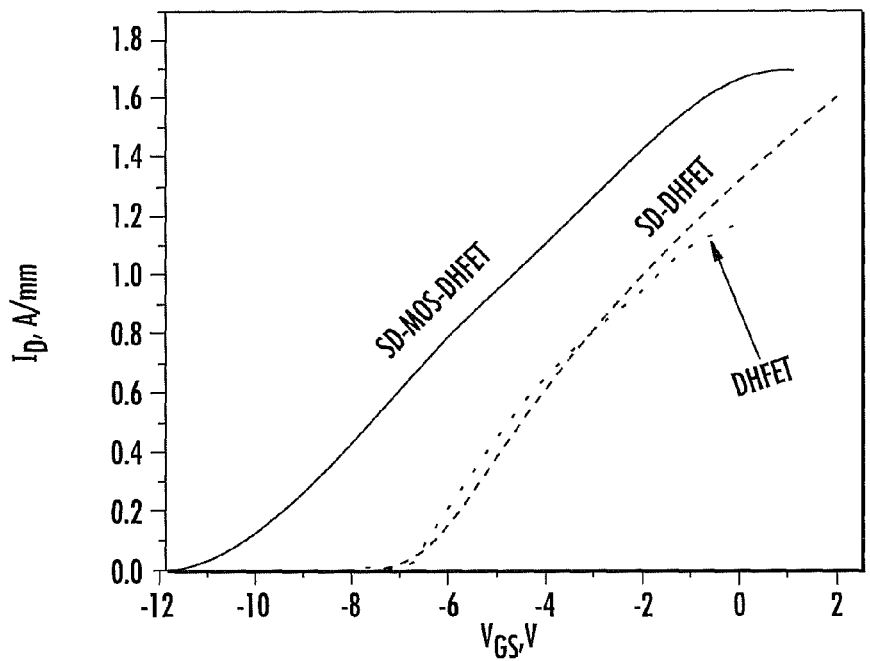
FIG. 21 shows transfer characteristics comparison for DHFET and SD MOS-DHFET.

Both DHFET and MOS-DHFET devices with a gate length and width of 0.7 μm/200 μm and a source-drain spacing of 4 μm were then fabricated. These devices were positioned both on the selectively doped (SD) regions and on regions where there was no selective doping. For the MOS-DHFET devices, a 160 Å thick PECVD deposited $SiO_2$ layer was used as the gate insulator. The devices were then covered with a 750 Å thick $Si_3N_4$, on top of which 1.7 μm long field-plates were fabricated. The field plate electrodes overlapped the gate and they had a 1 μm overhang toward the drain. The transfer characteristics of these devices are compared in FIG. 21. As seen, the peak currents are 1.67 A/mm for the SD-MOS-DHFETs and 1.6 A/mm for the SD-DHFET as compared to 1.15 A/mm for the reference DHFETs. The SD-DHFET devices showed fairly high gate leakage currents (around 2 mA at −10 V for 100 μm wide device). We believe that excessive gate currents are due to the doped regions located too close to the gate area and/or due to possible minor gate misalignment. High gate leakage adversely affects the device RF performance and its reliability. In the SD-MOS-DHFETs, the gate dielectric layer effectively suppressed the leakage currents down to around 1.5 nA at reverse bias of −15 V and to around 1 μA even at a forward gate bias up to +7 V. Note the leakage current of SD-MOS-DHFET is lower than that of the reference DHFET.

Figure 22:
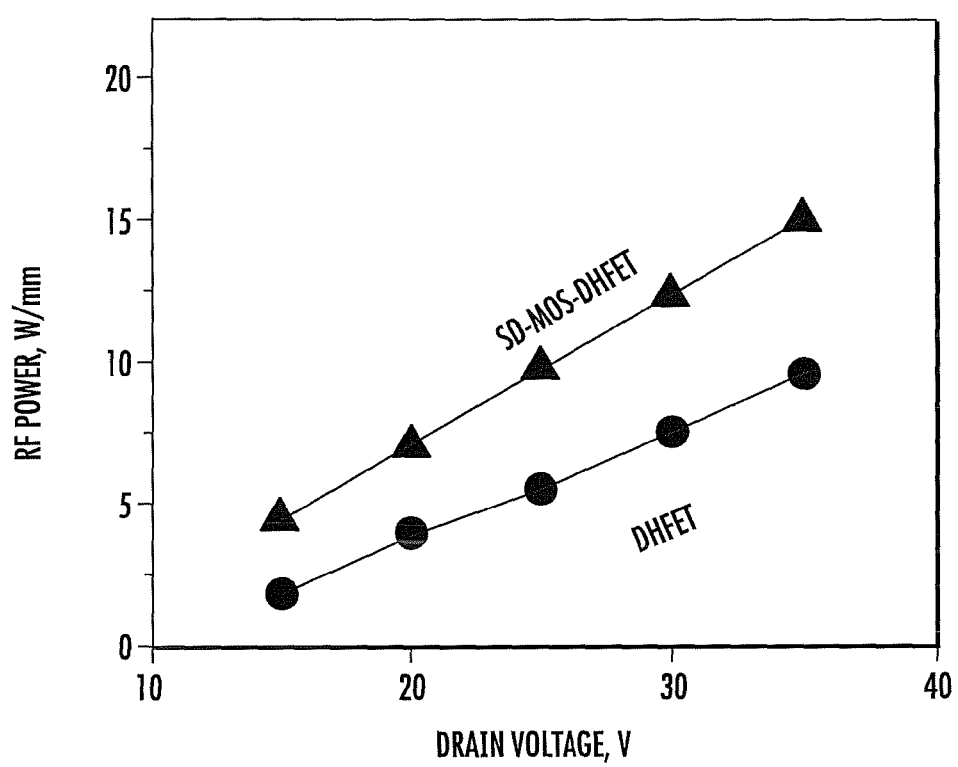
FIG. 22 shows cw RF power-drain bias dependencies for a reference DHFET and a SD MOS-DHFET at 2 GHz.

Finally, MOS-DHFET devices fabricated on SD regions and DHFETs fabricated on the regions without selective doping) were tested for RF power performance using Maury automated tuner system at 2 GHz. The RF powers-drain bias dependencies (at 3 dB compression) for these two device types are compared in FIG. 22. The corresponding PVE points are also plotted in FIG. 22. As seen, the SD-MOS-DHFET demonstrates a PVE value as high as 0.43 W/V-mm (15 W/mm at 35 V drain bias), which is much higher than the 0.36 W/V-mm for a DHFET. To the best of our knowledge, this is the highest reported PVE value for a GaN—AlGaN HFETs. Note that, even the highest PVE values reported in this work are still below the theoretically estimated values for devices with peak currents of 1.6-1.7 A/mm. Thus, in spite of the field plate device geometries some RF dispersion remains which results in higher knee voltages and lower peak currents under the large RF drive.

The SD MOS-DHFET devices exhibited stable operation at the cw peak rf-power levels of 12.5 W/mm (the drain bias $V_D$=30 V). The output power variation was less than 0.5 dB for 120 hours, which was the time duration for our rf-stability test under cw-operation. We attribute the high device stability to the low gate leakage currents in our insulated gate device design.

We demonstrated a high-current high-power insulated gate MOS-DHFET using a new barrier doping scheme and an innovative post-growth selective-area doping (SD) approach. This allowed us to simultaneously reduce the sheet resistance in the transistor access regions and the contact resistance with the use of anneal temperatures as low as 650° C. The SD technique is especially effective in combination with an insulated gate device design which efficiently suppresses the gate leakage currents resulting from the high barrier doping. The SD MOSDHFET demonstrated maximum RF power density of 15 W/mm at 35 V drain bias and stable operation at 12.5 W/mm RF power density during 120 hours stress.

Our new device design yielded MOS-DHFETs with peak drain currents as high as 1.6 A/mm and stable RF output powers of 15 W/mm at 2 GHz, at a drain bias of only 35 V. This to date represents the highest RF power densities at a drain bias of only 35 V and the highest achieved PVE values.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

The invention claimed is:

1. A method of forming a substrate having an epilayer that is selectively doped with a plurality of doping materials that affect the conductivity of the epilayer, the method comprising:

depositing a first doping material directly on the epilayer defined on the substrate, wherein the epilayer comprises a group III nitride epilayer, and wherein the first doping material comprises silicon oxide, silicon nitride, or silicon oxynitride;

depositing a photo-resist layer directly on the first doping material;

removing a first portion of the photo-resist layer to expose the underlying first doping material only directly under the first portion of the photo-resist layer removed, leaving a second portion of the photo-resist layer remaining on the first doping material;

applying an etchant to remove the second portion of the photo-resist layer remaining on the substrate and to remove the first doping material exposed by the first portion of the photo-resist layer removed such that the first doping material remaining on the substrate corresponds to where the second portion of the photo-resist layer is removed with the etchant;

annealing the substrate to dope about 10% to about 50% of the first doping material remaining on the substrate into the group III nitride epilayer to form first doped regions in the group III nitride epilayer while leaving an undoped portion of the first doping material remaining on the group III nitride epilayer;

removing the undoped portion of the first doping material remaining on the group III nitride epilayer;

after the removing the undoped portion, depositing a second doping material directly on the group III nitride epilayer, the second doping material comprising silicon oxide, silicon nitride, or silicon oxynitride;

after the depositing of the second doping material, depositing a second photo-resist layer directly on the second doping material;

removing a first portion of the second photo-resist layer to expose the underlying second doping material only directly under the first portion of the second photo-resist layer;

etching to remove the second photo-resist layer remaining on the substrate and to remove the second doping material exposed by the first portion of the second photo-resist layer removed, wherein the etching results in the second doping material remaining on the substrate corresponding to a location of the second photo-resist layer remaining on the substrate prior to the etching of the second photo-resist layer; and annealing the substrate to dope about 10% to about 50% of the second doping material remaining on the substrate into the group III nitride epilayer to form second doped regions in the group III nitride epilayer.

2. The method as in claim 1, wherein the first doping material is deposited using a digital oxide deposition technique, a digital nitride deposition technique, or a combination thereof.

3. The method as in claim 1, wherein the first doping material is deposited to a thickness of 50 Å to about 250 Å.

4. The method as in claim 1, wherein the second doping material is deposited to a thickness of 50 Å to about 250 Å.

5. The method as in claim 1, wherein the second doping material is different than the first doping material.

* * * * *